(12) United States Patent
Lin

(10) Patent No.: US 9,153,393 B2
(45) Date of Patent: *Oct. 6, 2015

(54) MANUFACTURING METHOD OF TOUCH PANEL

(71) Applicant: Chih-Chung Lin, Taipei (TW)

(72) Inventor: Chih-Chung Lin, Taipei (TW)

(73) Assignee: Chih-Chung Lin, Taipei (TW)

( * ) Notice: Subject to any disclaimer, the term of this patent is extended or adjusted under 35 U.S.C. 154(b) by 218 days.

This patent is subject to a terminal disclaimer.

(21) Appl. No.: 13/760,056

(22) Filed: Feb. 6, 2013

(65) Prior Publication Data

US 2014/0165383 A1    Jun. 19, 2014

(30) Foreign Application Priority Data

Dec. 19, 2012    (TW) ................................ 101148201

(51) Int. Cl.
*H01H 11/00*    (2006.01)
*H01L 21/308*    (2006.01)
*G06F 3/0488*    (2013.01)

(52) U.S. Cl.
CPC .............. *H01H 11/00* (2013.01); *G06F 3/0488* (2013.01); *H01H 11/005* (2013.01); *H01L 21/308* (2013.01); *Y10T 29/49002* (2015.01); *Y10T 29/49105* (2015.01)

(58) Field of Classification Search
CPC ................... Y10T 29/49105; Y10T 29/49002; Y10T 29/49117; Y10T 29/49124; Y10T 29/49126; Y10T 29/49128; Y10T 29/49131; Y10T 29/49147; Y10T 29/49155; H01H 11/00; H01H 11/005; H01H 11/0056; H01L 21/308; H01L 21/283; G06F 3/0488; G06F 3/04883; G06F 3/044

USPC ........ 29/622, 592.1, 825, 829, 830, 831, 832, 29/842, 846; 345/173, 174, 156; 438/689; 216/13

See application file for complete search history.

(56) References Cited

U.S. PATENT DOCUMENTS

| | | | | |
|---|---|---|---|---|
| 8,217,916 | B2 * | 7/2012 | Anno | 345/174 |
| 8,564,550 | B2 * | 10/2013 | Hashimoto | 345/173 |
| 8,570,299 | B2 * | 10/2013 | Nozawa | 345/174 |
| 8,647,519 | B1 * | 2/2014 | Lin | 216/13 |
| 8,653,378 | B2 * | 2/2014 | Fan | 174/255 |
| 8,695,213 | B2 * | 4/2014 | Fan | 29/846 |
| 8,884,889 | B2 * | 11/2014 | Beom et al. | 345/173 |
| 2010/0026661 | A1 * | 2/2010 | Teramoto | 345/174 |
| 2011/0090159 | A1 * | 4/2011 | Kurashima | 345/173 |
| 2014/0125603 | A1 * | 5/2014 | Lin | 345/173 |
| 2014/0168535 | A1 * | 6/2014 | Lin | 349/12 |
| 2014/0313442 | A1 * | 10/2014 | Misaki | 349/12 |

* cited by examiner

*Primary Examiner* — Peter DungBa Vo
*Assistant Examiner* — Azm Parvez

(57) ABSTRACT

A manufacturing method of touch panel includes steps of: providing a substrate and defining a touch section and a non-touch section; disposing a shield layer on the non-touch section of the substrate; disposing a touch electrode layer with multiple touch electrodes on the touch section and the non-touch section by means of sputtering; covering the touch electrode layer with a metal mask and forming a metal wiring layer on the non-touch section by means of printing or sputtering and then removing the metal mask; performing lithography and etching processes to the touch electrode layer so as to form multiple touch electrodes; disposing an insulation layer on the junctions between the touch electrodes and the metal wires; disposing a lead layer with multiple metal leads on the insulation layer; and disposing a protection layer on the touch electrode layer and the metal wiring layer and the insulation layer.

12 Claims, 7 Drawing Sheets

MANUFACTURING METHOD OF TOUCH PANEL

This application claims the priority benefit of Taiwan patent application number 101148201 filed on Dec. 19, 2012.

BACKGROUND OF THE INVENTION

1. Field of the Invention

The present invention relates generally to a manufacturing method of touch panel, and more particularly to a manufacturing method of touch panel, which can save the cost for the masks to lower the manufacturing cost.

2. Description of the Related Art

Along with the rapid advance of information techniques, various digital products such as mobile phones, personal digital assistants (PDA), notebooks and tablets have been more and more popularized. These digital products have more functions and more beautiful appearances and can be more conveniently used.

It is known that the display screen of a digital product such as mobile phone, PDA, notebook and tablet is an inevitable human/device communication interface. The display screen facilitates operation of the digital product. Generally, the display screen is a liquid crystal display as a mainstream.

In recent years, along with the rapid development of information techniques, wireless mobile communication industries and domestic electrical information appliances, various information products have employed touch panels instead of the conventional input devices such as keyboards and mice. In the touch panels, capacitive touch liquid crystal display devices have become the most popular products at the present time.

The touch liquid crystal display device is shortened to touch panel hereinafter. The touch panel is laminated structure including glass substrate, touch electrode layer, shield layer, electrode wiring layer, insulation layer and protection layer. These layers are stacked to form the laminated structure. The glass substrate has a touch section and a non-touch section. The touch electrode layer is coated on rear side of the touch section of the glass substrate by means of sputtering. Then the touch electrodes are formed by means of lithography and etching processes. Then an ink layer is printed on the non-touch section of the substrate as the shield layer. Then the electrode wiring layer is coated on the shield layer by means of sputtering. Then the electrode wires are formed by means of lithography and etching processes. Then insulation ink is printed on the touch electrode extension ends and the non-corresponding electrode wires in the shield section so as to avoid short-circuit between the touch electrode extension ends and the non-corresponding electrode wires. Then, the protection layer is coated on the glass substrate, the touch electrode layer, the shield layer, the electrode wiring layer and the insulation layer by means of coating. In the conventional manufacturing method of touch panel, the touch electrodes and the electrode wires are formed by means of sputtering, lithography and etching processes. The cost for the mask is quite high and the sputtering process is quite time-consuming. As a result, the manufacturing cost of the conventional touch panel is very high and the manufacturing time of the conventional touch panel is relatively long.

SUMMARY OF THE INVENTION

It is therefore a primary object of the present invention to provide a manufacturing method of touch panel, which can shorten the manufacturing time of the touch panel.

It is a further object of the present invention to provide the above manufacturing method of touch panel, which can lower the manufacturing cost of the touch panel.

To achieve the above and other objects, the manufacturing method of touch panel of the present invention includes steps of:

providing a substrate and defining a touch section and a non-touch section;

disposing a shield layer on the non-touch section of the substrate;

disposing a touch electrode layer with multiple touch electrodes on the touch section and the non-touch section of the substrate;

covering the touch electrode layer with a metal mask and forming a metal wiring layer with multiple metal wires on a section of the non-touch section, which section is not covered by the metal mask and then removing the metal mask;

performing lithography and etching processes to the touch electrode layer so as to form multiple touch electrodes;

disposing an insulation layer on the junctions between the touch electrodes and the metal wires, the insulation layer being preformed with multiple electrical connection holes;

disposing a lead layer with multiple metal leads on the insulation layer, the metal leads passing through the electrical connection holes to electrically connect with the metal wires and the touch electrodes; and disposing a protection layer on the touch electrode layer and the metal wiring layer and the insulation layer.

According to the manufacturing method of touch panel of the present invention, the manufacturing time is greatly shortened and the use of the mask is reduced so that the manufacturing cost is lowered.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
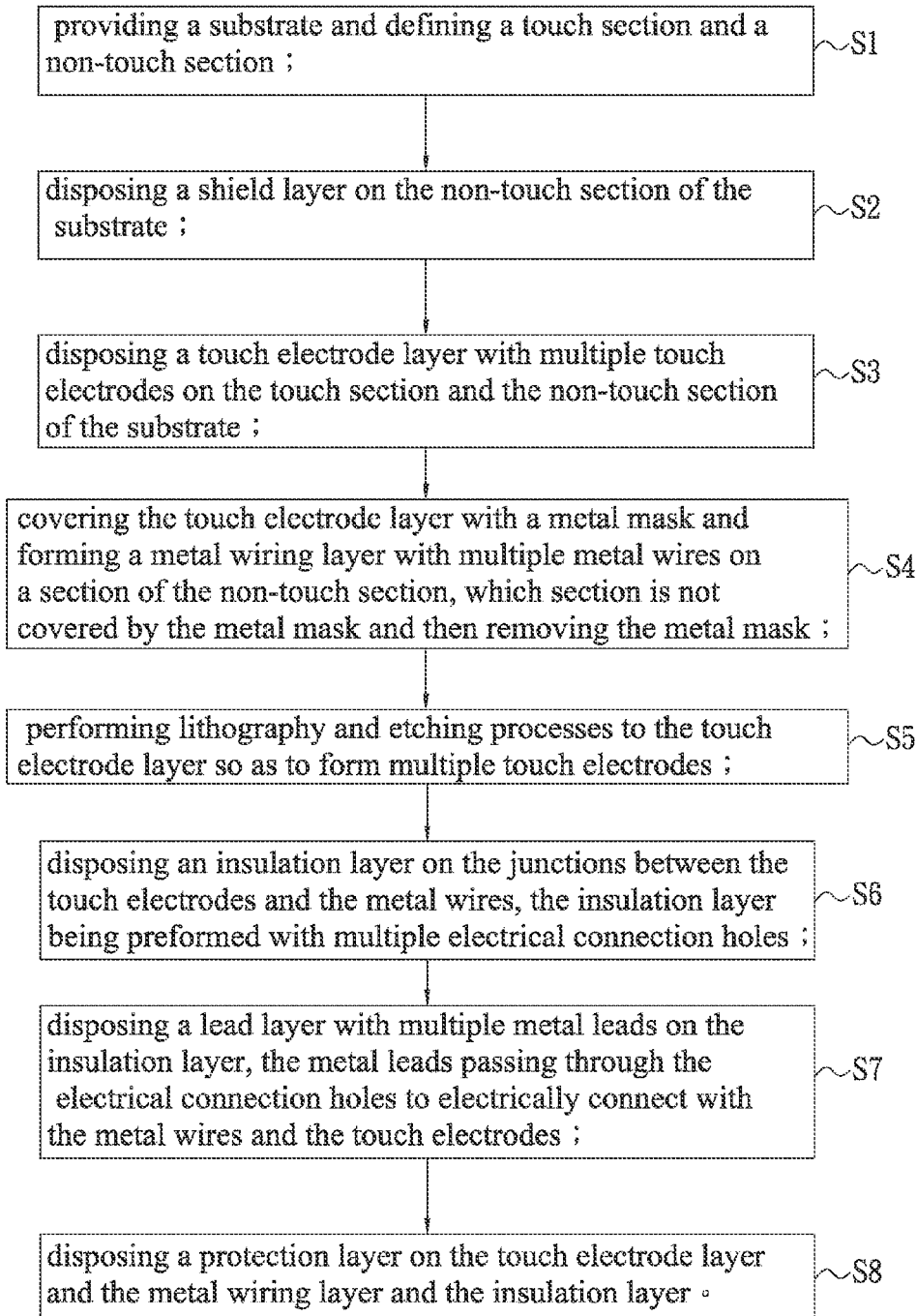
FIG. 1 is a flow chart of a first embodiment of the manufacturing method of touch panel of the present invention.
Figure 2:
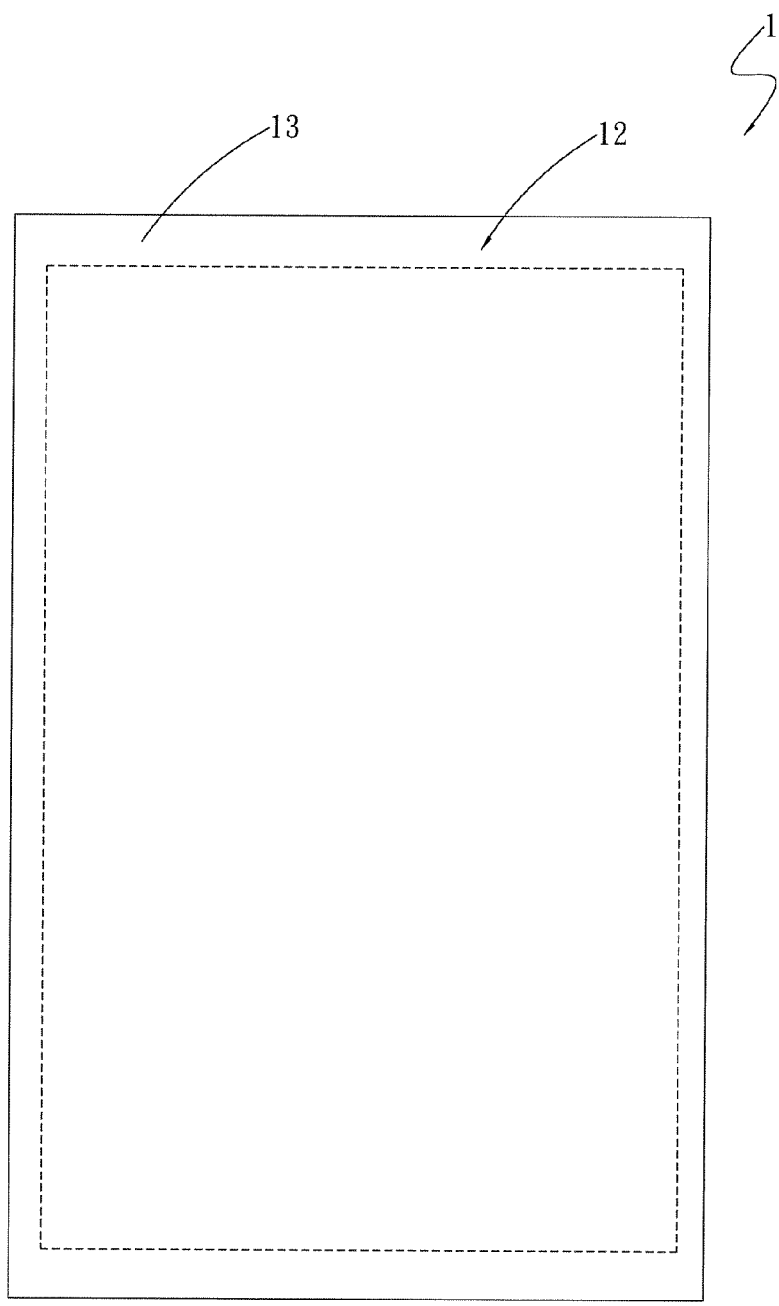
FIG. 2 is a schematic diagram showing the structure of the touch panel of the first embodiment of the manufacturing method of touch panel of the present invention.
Figure 3:
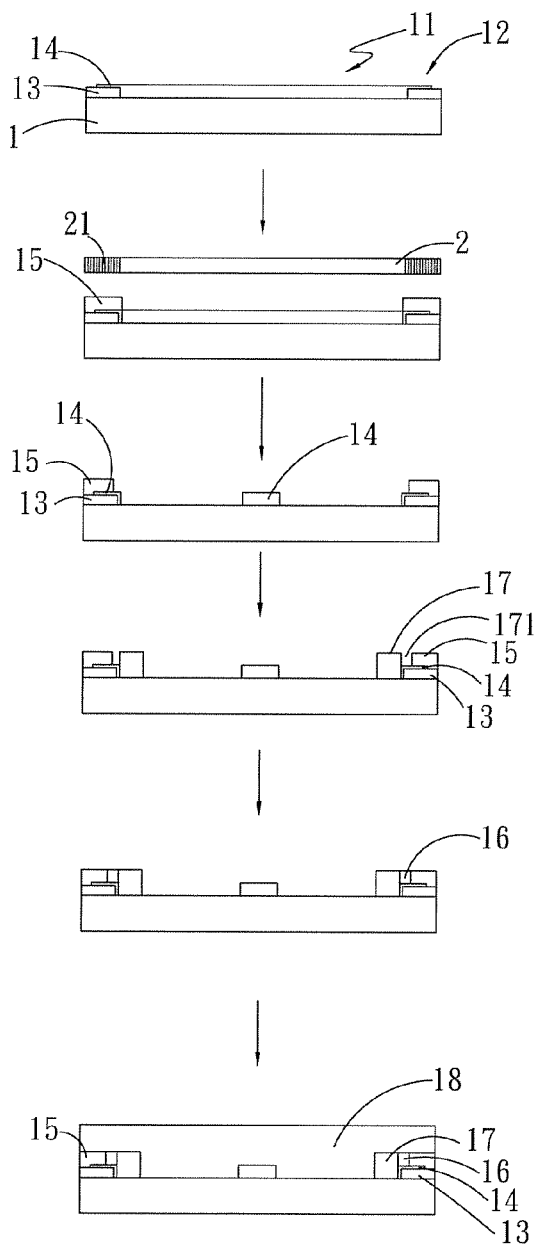
FIG. 3 is a schematic diagram showing the first embodiment of the manufacturing method of touch panel of the present invention.

Please refer to FIGS. 1, 2 and 3. FIG. 1 is a flow chart of a first embodiment of the manufacturing method of touch panel of the present invention. FIG. 2 is a schematic diagram showing the structure of the touch panel of the first embodiment of the manufacturing method of touch panel of the present invention. FIG. 3 is a schematic diagram showing the first embodiment of the manufacturing method of touch panel of the present invention. According to the first embodiment, the manufacturing method of touch panel of the present invention includes steps of:

S1. providing a substrate and defining a touch section and a non-touch section, a substrate 1 being provided, the substrate 1 being a transparent board material made of glass or polymer material, a central section of the substrate 1 being defined as a touch section 11, a section of the substrate 1 around the touch section 11 being defined as a non-touch section 12, in this embodiment, the substrate 1 being made of transparent glass material by means of a process, which is identical to that of the conventional manufacturing method and thus will not be further described hereinafter;

S2. disposing a shield layer on the non-touch section of the substrate, an ink being sprayed onto the non-touch section 12 to form a shield layer 13 thereon, the shield layer 13 being formed on the non-touch section 12 by means of halftone print process or plate print process;

S3. disposing a touch electrode layer with multiple touch electrodes on the touch section and the non-touch section of the substrate, a touch electrode layer 14 being formed on the touch section 11 and the non-touch section 12 of the substrate 1 by means of sputtering, the touch electrode layer 14 being selected from a group consisting of indium tin oxide (ITO), indium zinc oxide, indium tin zinc oxide, hafnium oxide, zinc oxide, aluminum oxide, aluminum tin oxide, aluminum zinc oxide, cadmium tin oxide and cadmium zinc oxide;

S4. covering the touch electrode layer with a metal mask and forming a metal wiring layer with multiple metal wires on a section of the non-touch section, which section is not covered by the metal mask and then removing the metal mask, a metal mask 2 being placed on the substrate 1 to cover both the touch section 11 and the non-touch section 12, a section of the metal mask 2 that covers the non-touch section 12 being formed with multiple through holes 21, by means of printing, sputtering or other measure, wires being directly wired on a section of upper side of the non-touch section 12 corresponding to the shield layer 13, which section is not covered by the metal mask 2, after the wires are wired, the metal mask 2 being removed to achieve the metal wiring layer 15;

S5. performing lithography and etching processes to the touch electrode layer so as to form multiple touch electrodes, lithography and etching processes being performed to the touch electrode layer 14 to form multiple touch electrodes on the touch section 11, the etching liquid applied to the touch electrode layer being selected from a group consisting of nitric acid, hydrochloric acid and water, the etching liquid applied to the metal wiring layer being selected from a group consisting of phosphate, nitric acid, acetic acid and water;

S6. disposing an insulation layer on the junctions between the touch electrodes and the metal wires, the insulation layer being preformed with multiple electrical connection holes, an insulation layer 17 being coated on the junctions between the touch electrodes and the metal wires on the non-touch section 12, the insulation layer being preformed with multiple electrical connection holes 171 corresponding to the junctions between the touch electrodes and the metal wires, the insulation layer 17 being formed by means of halftone print process or plate print process, the insulation layer 17 being made of a material with a dielectric coefficient of 2~4, which can be a transparent insulation material such as ink or a nontransparent insulation material or an inorganic material or an organic material, the inorganic material being selected from a group consisting of silicon oxide, silicon nitride, silicon oxynitride, silicon carbide, hafnium oxide and aluminum oxide, the organic material being selected from a group consisting of photoresistor, enzocyclobutane (BCB), cycloolefins, polyesters, polyalcohols, polyethylene oxides, polyphenylenes, resins, polyethers and polyketones;

S7. disposing a lead layer with multiple metal leads on the insulation layer, the metal leads passing through the electrical connection holes to electrically connect with the metal wires and the touch electrodes, metal leads being disposed on the insulation layer 17 and in the preformed electrical connection holes 171 by means of silver paste printing or sputtering so as to electrically connect the touch electrodes to the metal wires; and S8. disposing a protection layer on the touch electrode layer and the metal wiring layer and the insulation layer, a protection layer 18 being formed on the touch electrode layer 14, the metal wiring layer 15 and the insulation layer 17 by means of deposition so as to protect the touch electrode layer 14, the metal wiring layer 15, the insulation layer 17, the lead layer 16 and the metal leads, the protection layer being made of an inorganic material or an organic material, the inorganic material being selected from a group consisting of silicon oxide, silicon nitride, silicon oxynitride, silicon carbide, hafnium oxide and aluminum oxide, the organic material being selected from a group consisting of photoresistor, enzocyclobutane (BCB), cycloolefins, polyesters, polyalcohols, polyethylene oxides, polyphenylenes, resins, polyethers and polyketones.

Figure 4:
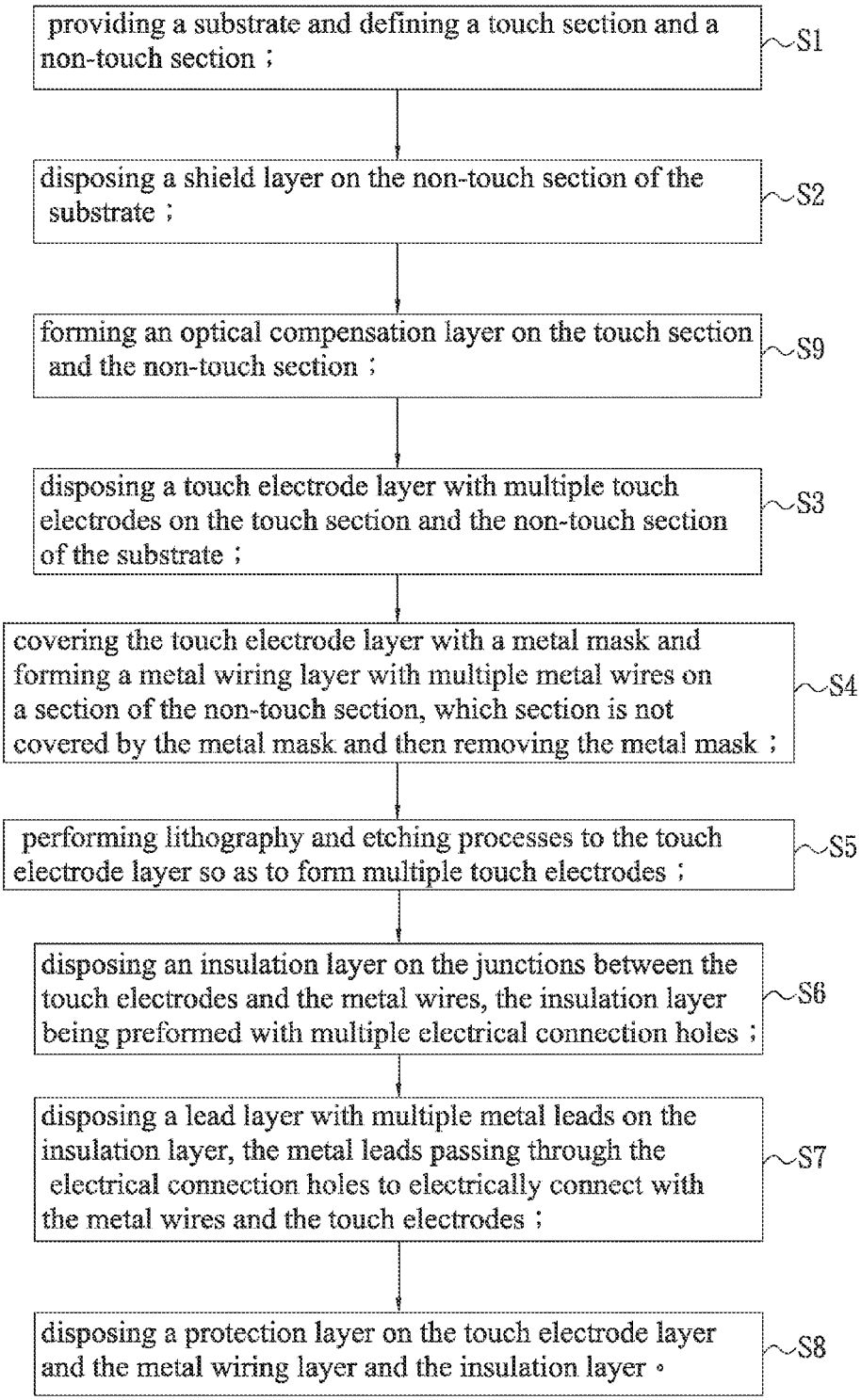
FIG. 4 is a flow chart of a second embodiment of the manufacturing method of touch panel of the present invention.
Figure 5:
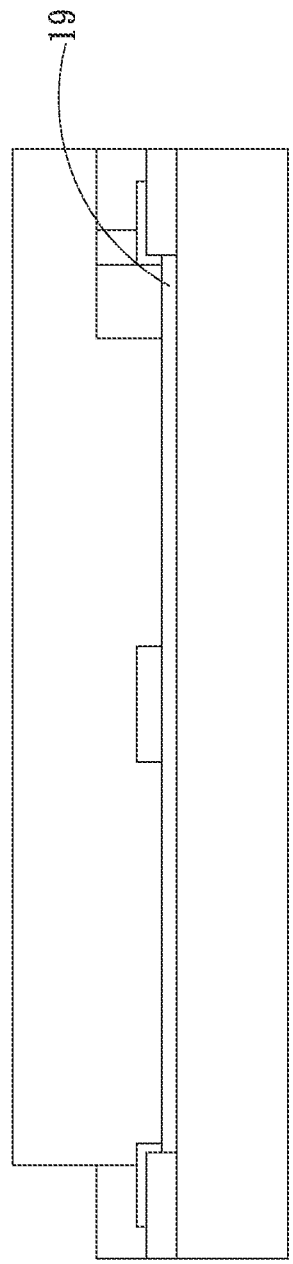
FIG. 5 is a schematic diagram showing the structure of the touch panel of the second embodiment of the manufacturing method of touch panel of the present invention.
Figure 6A:
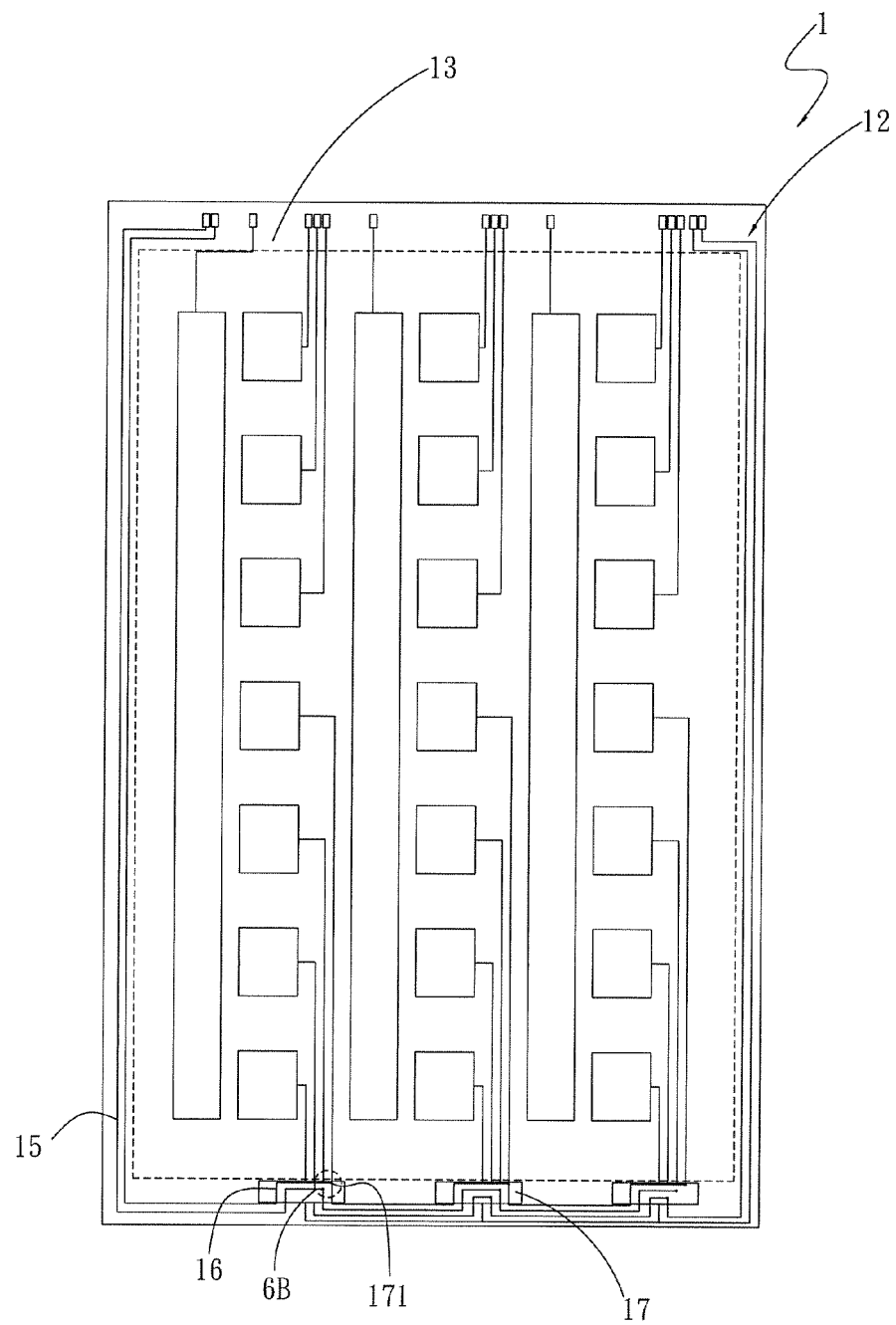
FIG. 6A is a schematic diagram showing the finishing structure of the touch panel of the first embodiment of the manufacturing method of touch panel of the present invention.
Figure 6B:
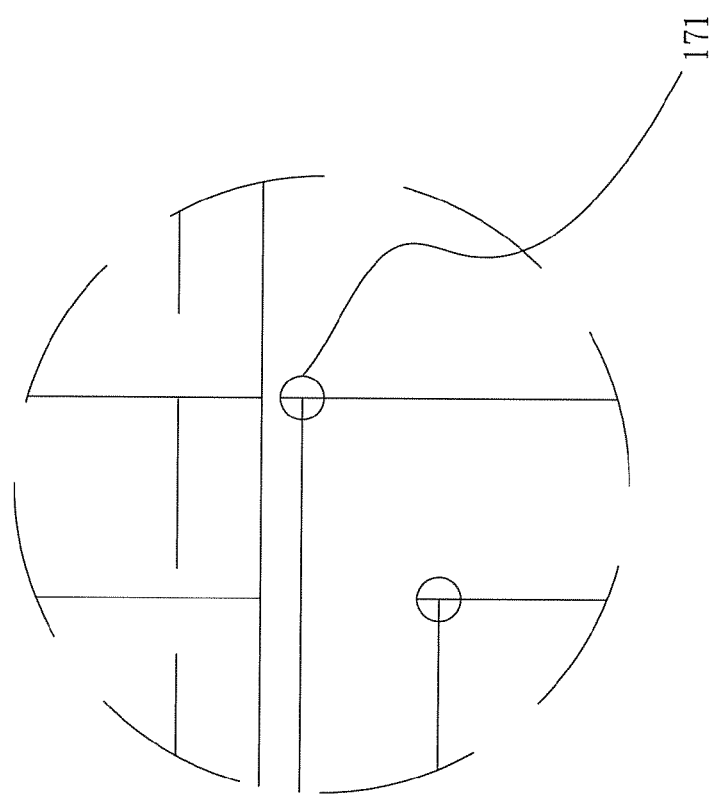
FIG. 6B is a partial enlarged detail showing the FIG. 6A.

Please refer to FIGS. 4 and 5. FIG. 4 is a flow chart of a second embodiment of the manufacturing method of touch panel of the present invention. FIG. 5 is a schematic diagram showing the structure of the touch panel of the second embodiment of the manufacturing method of touchpad of the present invention. According to the second embodiment, the manufacturing method of touch panel of the present invention includes steps of:

S1. providing a substrate and defining a touch section and a non-touch section;

S2. disposing a shield layer on the non-touch section of the substrate;

S3. disposing a touch electrode layer with multiple touch electrodes on the touch section and the non-touch section of the substrate;

S4. covering the touch electrode layer with a metal mask and forming a metal wiring layer with multiple metal wires on a section of the non-touch section, which section is not covered by the metal mask and then removing the metal mask;

S5. performing lithography and etching processes to the touch electrode layer so as to form multiple touch electrodes;

S6. disposing an insulation layer on the junctions between the touch electrodes and the metal wires, the insulation layer being preformed with multiple electrical connection holes;

S7. disposing a lead layer with multiple metal leads on the insulation layer, the metal leads passing through the electrical connection holes to electrically connect with the metal wires and the touch electrodes; and S8. disposing a protection layer on the touch electrode layer and the metal wiring layer and the insulation layer.

The second embodiment is partially identical to the first embodiment and thus will not be further described hereinafter. The second embodiment is different from the first embodiment in that between step S2 of disposing a shield layer on the non-touch section of the substrate and step S3 of disposing a touch electrode layer with multiple touch electrodes on the touch section and the non-touch section of the substrate, the second embodiment further includes a step S9 of forming an optical compensation layer 19 on the touch section and the non-touch section.

According to the manufacturing method of touchpad of the present invention, the manufacturing time is greatly shortened and the use of the mask is reduced so that the manufacturing cost is lowered.

The present invention has been described with the above embodiments thereof and it is understood that many changes and modifications in the above embodiments can be carried out without departing from the scope and the spirit of the invention that is intended to be limited only by the appended claims.

What is claimed is:

1. A manufacturing method of touch panel, comprising steps of:
   providing a substrate and defining a touch section and a non-touch section;
   disposing a shield layer on the non-touch section of the substrate;
   disposing a touch electrode layer with multiple touch electrodes on the touch section and the non-touch section of the substrate;
   covering the touch electrode layer with a metal mask and forming a metal wiring layer with multiple metal wires on a section of the non-touch section, which section is not covered by the metal mask and then removing the metal mask;
   performing lithography and etching processes to the touch electrode layer so as to form multiple touch electrodes;
   disposing an insulation layer on a plurality of junctions between the touch electrodes and the metal wires, the insulation layer being preformed with multiple electrical connection holes;
   disposing a lead layer with multiple metal leads on the insulation layer, the metal leads passing through the electrical connection holes to electrically connect with the metal wires and the touch electrodes; and
   disposing a protection layer on the touch electrode layer and the metal wiring layer and the insulation layer.

2. The manufacturing method of touch panel as claimed in claim 1, wherein the touch electrode layer is formed on the substrate by means of sputtering.

3. The manufacturing method of touch panel as claimed in claim 1, wherein an ink is sprayed onto the non-touch section to form the shield layer.

4. The manufacturing method of touch panel as claimed in claim 1, wherein the touch electrode layer being selected from a group consisting of indium tin oxide (ITO), indium zinc oxide, indium tin zinc oxide, hafnium oxide, zinc oxide, aluminum oxide, aluminum tin oxide, aluminum zinc oxide, cadmium tin oxide and cadmium zinc oxide.

5. The manufacturing method of touch panel as claimed in claim 1, wherein the insulation layer is formed by means of halftone print or plate print.

6. The manufacturing method of touch panel as claimed in claim 1, wherein the protection layer is made of an inorganic material or an organic material.

7. The manufacturing method of touch panel as claimed in claim 6, wherein the inorganic material is selected from a group consisting of silicon oxide, silicon nitride, silicon oxynitride, silicon carbide, hafnium oxide and aluminum oxide and the organic material is selected from a group consisting of photoresistor, enzocyclobutane (BCB), cycloolefins, polyesters, polyalcohols, polyethylene oxides, polyphenylenes, resins, polyethers and polyketones.

8. The manufacturing method of touch panel as claimed in claim 1, further comprising a step of forming an optical compensation layer on the touch section and the non-touch section after the step of disposing a shield layer on the non-touch section of the substrate.

9. The manufacturing method of touch panel as claimed in claim 1, wherein the insulation layer is made of an inorganic material or an organic material.

10. The manufacturing method of touch panel as claimed in claim 9, wherein the inorganic material is selected from a group consisting of silicon oxide, silicon nitride, silicon oxynitride, silicon carbide, hafnium oxide and aluminum oxide and the organic material is selected from a group consisting of photoresistor, enzocyclobutane (BCB), cycloolefins, polyesters, polyalcohols, polyethylene oxides, polyphenylenes, resins, polyethers and polyketones.

11. The manufacturing method of touch panel as claimed in claim 1, wherein in the lithography and etching processes, the etching liquid applied to the touch electrode layer is selected from a group consisting of nitric acid, hydrochloric acid and water and the etching liquid applied to the metal wiring layer is selected from a group consisting of phosphate, nitric acid, acetic acid and water.

12. The manufacturing method of touch panel as claimed in claim 1, wherein the lead layer is disposed on the insulation layer by means of silver paste printing or sputtering.

* * * * *